United States Patent
Harima

(10) Patent No.: US 9,143,114 B2
(45) Date of Patent: Sep. 22, 2015

(54) BONDING TYPE CRYSTAL CONTROLLED OSCILLATOR

(71) Applicant: NIHON DEMPA KOGYO CO., LTD., Tokyo (JP)

(72) Inventor: Hidenori Harima, Saitama (JP)

(73) Assignee: NIHON DEMPA KOGYO CO., LTD., Tokyo (JP)

( * ) Notice: Subject to any disclaimer, the term of this patent is extended or adjusted under 35 U.S.C. 154(b) by 0 days.

(21) Appl. No.: 14/258,026

(22) Filed: Apr. 22, 2014

(65) Prior Publication Data

US 2014/0320225 A1    Oct. 30, 2014

(30) Foreign Application Priority Data

Apr. 24, 2013 (JP) .................................. 2013-091289

(51) Int. Cl.
| | |
|---|---|
| G04F 5/06 | (2006.01) |
| H03B 5/32 | (2006.01) |
| H03H 9/10 | (2006.01) |
| H03H 9/17 | (2006.01) |
| H03H 9/05 | (2006.01) |

(52) U.S. Cl.
CPC .................. *H03H 9/10* (2013.01); *G04F 5/063* (2013.01); *H03B 5/32* (2013.01); *H03H 9/0509* (2013.01); *H03H 9/0519* (2013.01); *H03H 9/0547* (2013.01); *H03H 9/0561* (2013.01); *H03H 9/1014* (2013.01); *H03H 9/17* (2013.01)

(58) Field of Classification Search
CPC ............. G04F 5/04; G04F 5/06; G04F 5/063; H03B 5/30; H03B 5/32; H03B 5/323; H03B 5/326; H03B 5/36; H03B 2200/0016; H03B 2200/0018; H03B 2200/002; H03H 3/007; H03H 3/0072; H03H 3/0073; H03H 3/02; H03H 3/08; H03H 9/05; H03H 9/0509; H03H 9/0514; H03H 9/0519; H03H 9/0523; H03H 9/0538; H03H 9/0547; H03H 9/0561; H03H 9/0585; H03H 9/10; H03H 9/1021; H03H 9/1035; H03H 9/1042; H03H 9/105; H03H 9/1071; H03H 9/1092; H03H 9/15; H03H 9/17; H03L 1/028

USPC ......... 29/25.35; 310/311, 344, 348, 349, 368, 310/370; 331/68, 69, 154, 156, 158

See application file for complete search history.

(56) References Cited

U.S. PATENT DOCUMENTS

| | | | | |
|---|---|---|---|---|
| 6,223,429 B1 * | 5/2001 | Kaneda et al. | ................... | 29/832 |
| 6,475,823 B1 * | 11/2002 | Sakano et al. | ................... | 438/53 |
| 7,793,413 B2 * | 9/2010 | Sakai et al. | ..................... | 29/840 |

(Continued)

FOREIGN PATENT DOCUMENTS

| | | |
|---|---|---|
| JP | 2000-349555 | 12/2000 |
| JP | 2009-105628 | 5/2009 |
| JP | 2013-219738 | 10/2013 |

*Primary Examiner* — Levi Gannon
(74) *Attorney, Agent, or Firm* — Jianq Chyun IP Office

(57) ABSTRACT

A bonding type crystal controlled oscillator includes a crystal package and a circuit package bonded by two-tier bonding. An anisotropy conductive adhesive is interposed between back surface of the crystal package facing the circuit package and an upper surface of the circuit package facing the crystal package. The anisotropy conductive adhesive includes a thermosetting resin containing solder micro particles dispersed in the thermosetting resin. Assuming that a thickness of the output terminal formed at the crystal package is C μm, a thickness of the external terminal formed at the circuit package is D μm, and an average outside diameter of the solder micro particles dispersed in the anisotropy conductive adhesive is E μm, the dimensional relation is set to (C+D)>E.

4 Claims, 5 Drawing Sheets

(56) References Cited

U.S. PATENT DOCUMENTS

| | | | |
|---|---|---|---|
| 7,821,347 B2* | 10/2010 | Harima | 331/158 |
| 8,148,253 B2* | 4/2012 | Ozono et al. | 438/612 |
| 8,188,605 B2* | 5/2012 | Sakai et al. | 257/779 |
| 2011/0249417 A1* | 10/2011 | Kawabata | 361/760 |
| 2013/0187723 A1* | 7/2013 | Harima et al. | 331/158 |

* cited by examiner

BONDING TYPE CRYSTAL CONTROLLED OSCILLATOR

CROSS REFERENCE TO RELATED APPLICATION

This application claims the priority benefit of Japan application serial no. 2013-091289, filed on Apr. 24, 2013. The entirety of the above-mentioned patent application is hereby incorporated by reference herein and made a part of this specification.

TECHNICAL FIELD

This disclosure relates to a surface mount type crystal controlled oscillator, and especially relates to a crystal controlled oscillator where a crystal package and a circuit package are bonded by two-tier bonding. The crystal package houses a crystal oscillator. The circuit package houses electronic circuit components such as an IC chip and constitutes an oscillation circuit with the crystal oscillator.

DESCRIPTION OF THE RELATED ART

A crystal controlled oscillator, for example, of a temperature compensation type, is often used in mobile communication devices such as a mobile phone. Nowadays, from an aspect of productivity, there is a surface mount type crystal controlled oscillator where a mounting board that houses electronic components is bonded to a bottom surface of a crystal resonator.

FIGS. 5A and 5B are cross-sectional schematic view illustrating a conventional surface mount type crystal controlled oscillator where a crystal package and a circuit package are bonded by two-tier bonding. FIG. 5A illustrates a state before bonding the two packages, and FIG. 5B illustrates a state where the two packages are bonded together. This crystal controlled oscillator has a configuration where a mounting surface (bottom wall (back surface)) of an output terminal (crystal output terminal) 2 of the crystal package 1, which houses a crystal element (not shown), and a mounting surface (upper surface) of an external terminal (crystal input terminal) 4 disposed at the circuit package 3, which houses an IC chip (not shown) constituting an oscillation circuit with the crystal element (not shown), are bonded as two tiers of top and bottom. The output terminal 2 of the crystal package 1 forms one step higher than a back surface 1A. The back surface 1A is the bottom surface and is where the output terminal 2 of the crystal package 1 stands. The external terminal 4 disposed at the circuit package 3 forms one step higher than an upper surface 3A. The upper surface 3A is a surface on which the external terminal 4 of the circuit package 3 is disposed.

The above-described crystal package 1 and circuit package 3 are electrically connected using an anisotropy conductive adhesive 6 with an adhesive property. This anisotropy conductive adhesive 6 includes a uniform dispersion of conductive particles within an adhesive agent with a high insulation property. The anisotropy conductive adhesive 6 is used to electrically connect opposing electrodes, to insulate between adjacent electrodes, and to secure between the packages. As an exemplary adhesive used for heat treatment including a reflow process is an epoxy resin with high heat resistance and high insulation, which contains conductive particles of solder powders (hereinafter, solder micro particles). One of the anisotropy conductive adhesives known does not require solder pre-coating on a surface of a bonding electrode.

On adhesion surfaces of the crystal package 1 and the circuit package 3, the anisotropy conductive adhesive 6, where solder micro particles 61 are dispersed across thermosetting resin (epoxy resin) 62, is applied (see FIG. 5A). The anisotropy conductive adhesive 6 is a thermosetting resin containing solder powders where solder micro particles 61 are dispersed in the thermosetting resin (epoxy resin) 62. In this example, the anisotropy conductive adhesive 6 formulated as a paste is applied on the upper surface 3A, on which the above-described external terminals 4 are disposed, and the external terminals 4 of the circuit package 3. For the anisotropy conductive adhesive 6, instead of a paste type, a liquid type is also available. A liquid type may be applied, or the anisotropy conductive adhesive 6 formed in a film form may be affixed. Containers (housing) of the crystal package 1 and the circuit package 3 are formed by molding a glass epoxy plate, ceramic plate, crystal plate, or glass plate.

On an upper surface 3A of the external terminal 4 in the circuit package 3, the anisotropy conductive adhesive 6 is applied. On the anisotropy conductive adhesive 6, a back surface 1A, which is the bottom surface where the output terminal 2 of the crystal package 1 is disposed, is positioned such that the above-described output terminal 2 correctly faces the above-described external terminal 4. Then both packages are pressurized and heat treated in a reflow furnace. This process bonds the crystal package 1 with the circuit package 3, as illustrated in FIG. 5B. That is, solder micro particles 61a between the output terminal 2 and the external terminal 4 are crushed between the output terminal 2 and the external terminal 4. The output terminal 2 and the external terminal 4 are electrically connected via the crushed solder micro particles 61a.

The anisotropy conductive adhesive 6 between the crystal package 1 and the circuit package 3 uses an epoxy resin, which melts in heating and hardens after cooling to bond the crystal package 1 and the circuit package 3 mechanically and strongly. A composite electronic component, which is a two-tier bonding type crystal controlled oscillator, is thus configured. The Japanese Unexamined Patent Application Publication Nos. 2000-349555 and 2009-105628 disclose conventional examples of two-tier bonding type crystal controlled oscillators.

FIG. 6 is a cross-sectional schematic view illustrating a cause of a bonding failure between a crystal package and a circuit package in a conventional surface mount type crystal controlled oscillator, which is a two-tier bonding type illustrated in FIGS. 5A and 5B. One or both of the upper surface 3A of the circuit package 3 and the back surface 1A of the crystal package 1 may have a non-flatness or non-parallel distortion such as a partial deflection. In that case, the solder micro particles 61 between the output terminal 2 of the crystal package 1 and the external terminal 4 of the circuit package 3 may stay uncrushed in pressurized heat treatment as illustrated in the area circled with B in FIG. 6.

FIG. 6 illustrates a state where the upper surface 3A, where one of the external terminals 4 of the circuit package 3 is disposed, has a partial non-parallel distortion, which is not parallel to the back surface 1A of the crystal package 1, to right down direction in this view. As a result, the solder micro particles 61 between the output terminal 2 of the crystal package 1 and the external terminal 4 of the circuit package 3 are not crushed enough or not crushed at all, and such solder micro particles 61 cause a failure of no electrical connection. Consequently, such faulty components lower the production yield. A similar failure would occur if there were non-parallel distortions, such as deflections, on both of the back surface 1A and the upper surface 3A. The back surface 1A is a surface of the crystal package 1 or is where the output terminal 2 of the crystal package 1 is disposed. The upper surface 3A is where the external terminal 4 of the circuit package 3 is disposed.

A need thus exists for a bonding type crystal controlled oscillator which is not susceptible to the drawbacks mentioned above.

SUMMARY

A bonding type crystal controlled oscillator according to the disclosure includes a crystal package and a circuit package. The crystal package houses a crystal oscillator. The circuit package houses an electronic circuit component constituting an oscillation circuit with the crystal oscillator. The circuit package and the crystal package are bonded by two-tier bonding. The crystal package includes a container that has a back surface facing the circuit package and includes a plurality of output terminals with a flat shape. The plurality of output terminals forms one step higher than the back surface. The circuit package includes an upper surface facing the crystal package and a plurality of external terminals with a flat shape disposed at positions corresponding to the plurality of output terminals formed on the crystal package. The plurality of external terminals form one step higher than the upper surface. An anisotropy conductive adhesive is interposed between the back surface of the crystal package facing the circuit package and the upper surface of the circuit package facing the crystal package, the anisotropy conductive adhesive including a thermosetting resin containing solder micro particles dispersed in the thermosetting resin. Assuming that a thickness of the output terminal formed at the crystal package is C µm, a thickness of the external terminal formed at the circuit package is D µm, and an average outside diameter of the solder micro particles dispersed in the anisotropy conductive adhesive is E µm, the dimensional relation is set to (C+D) >E.

BRIEF DESCRIPTION OF THE DRAWINGS

The foregoing and additional features and characteristics of this disclosure will become more apparent from the following detailed description considered with reference to the accompanying drawings.

DETAILED DESCRIPTION

Hereinafter, a detailed description will be given of embodiments of bonding type crystal controlled oscillators according to this disclosure with reference to the accompanying drawings.

Embodiment 1

Figure 1:
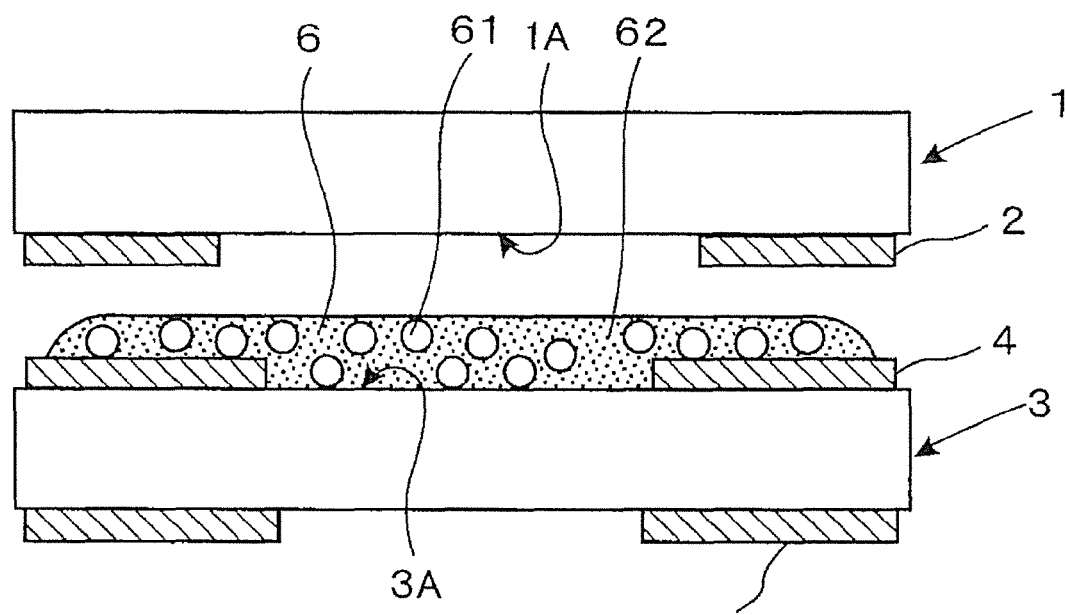
FIG. 1 is a cross-sectional schematic view illustrating a bonding type crystal controlled oscillator according to an embodiment 1 of this disclosure.
Figure 2:
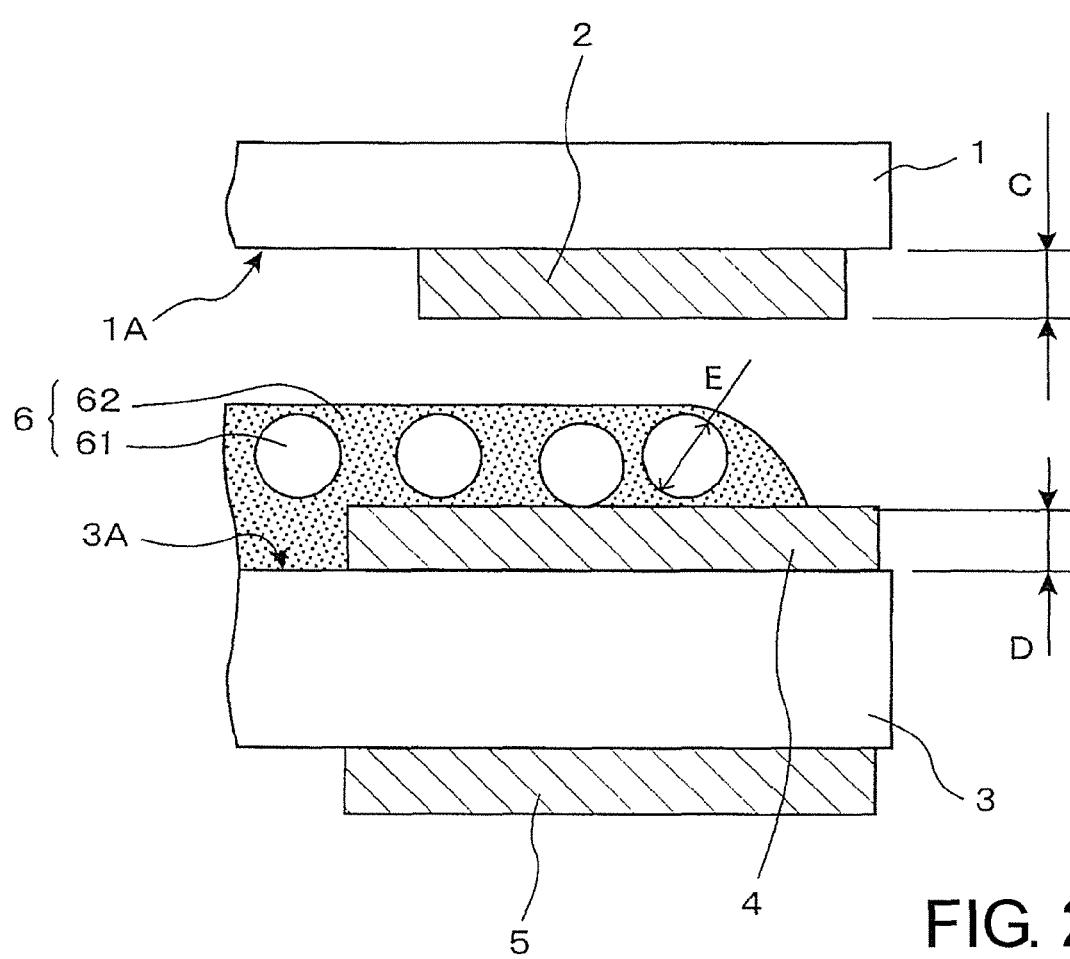
FIG. 2 is an enlarged cross-sectional schematic view of an area where a crystal package and a circuit package illustrated in FIG. 1 face each other.

FIG. 1 is a cross-sectional schematic view illustrating a bonding type crystal controlled oscillator according to an embodiment 1 of this disclosure. FIG. 2 is an enlarged cross-sectional schematic view of an area where a crystal package and a circuit package illustrated in FIG. 1 face each other. In these views, the same like reference numerals are used for the same functional components in FIGS. 5A and 5B and FIG. 6. A container of a crystal package 1 houses a crystal element (not shown). A circuit package 3 houses an IC chip (not shown), which constitutes an oscillation circuit together with the crystal element. The circuit package 3 of some crystal controlled oscillator types houses an IC chip integrated in a temperature control circuit or such a mechanism. The circuit package 3 of other crystal controlled oscillator types houses a temperature control circuit or such a mechanism along with an IC chip.

On a back surface 1A of the crystal package 1, a plurality of output terminals 2, which output oscillation signals from the crystal resonator, are disposed. An upper surface 3A of the circuit package 3 faces the above-described back surface 1A of the crystal package 1. On that upper surface 3A, an external terminal 4, which receives crystal element oscillation signals from the crystal package 1, is disposed.

The output terminal 2 disposed at the crystal package 1 forms one step higher than the back surface 1A of the crystal package 1. The external terminal 4 disposed at the circuit package 3 forms one step higher than the upper surface 3A of the circuit package 3. A like reference numeral 5 denotes a surface mounted terminal, which is used to mount this bonding type crystal controlled oscillator to a circuit board or similar of an applied device.

Figure 5A:
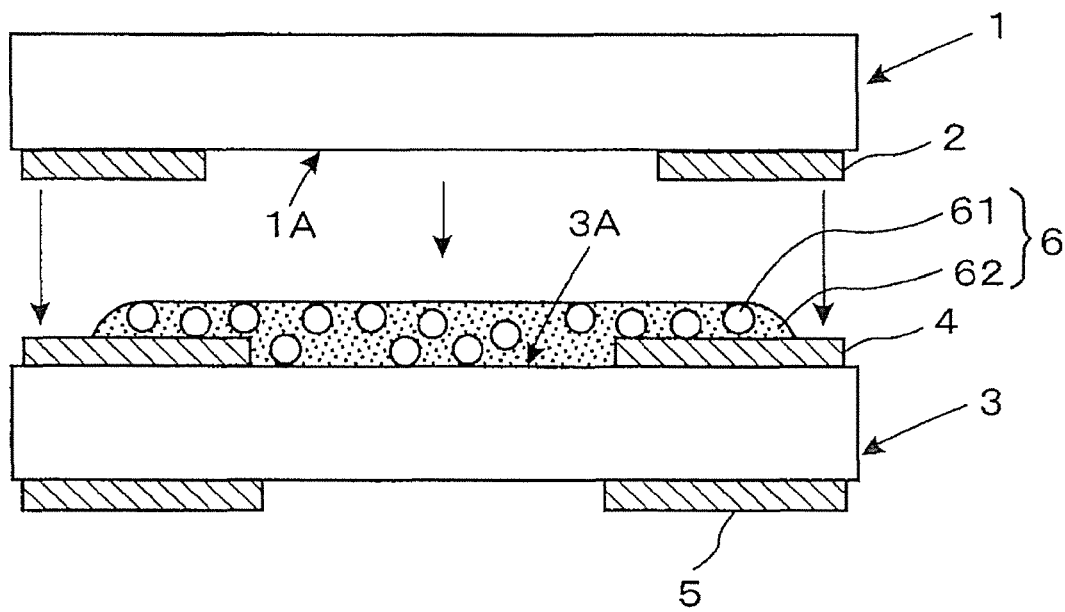
FIG. 5A is a cross-sectional schematic view illustrating a conventional surface mount type crystal controlled oscillator where a crystal package and a circuit package are to be bonded by two-tier bonding.
Figure 5B:
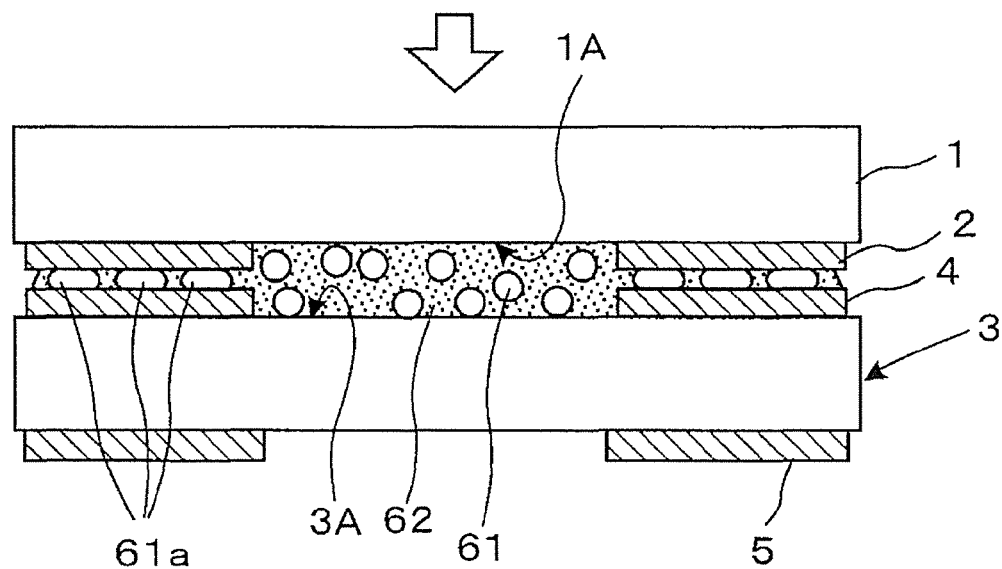
FIG. 5B is a cross-sectional schematic view illustrating the conventional surface mount type crystal controlled oscillator where a crystal package and a circuit package are bonded by two-tier bonding.
Figure 6:
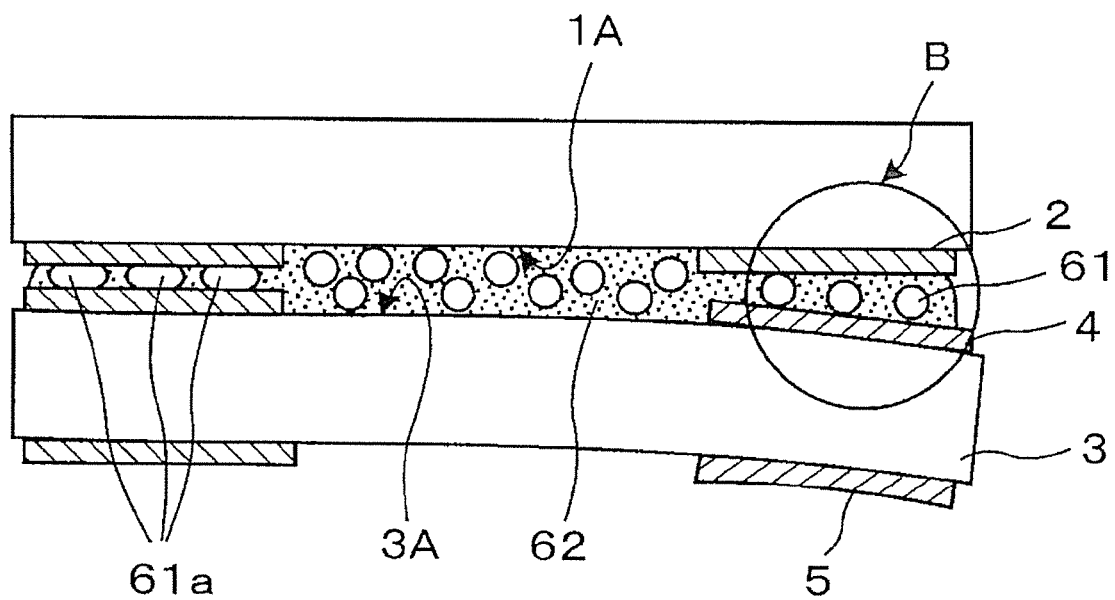
FIG. 6 is a cross-sectional schematic view illustrating a cause of a bonding failure between the crystal package and the circuit package, which are bonded by two-tier bonding in the conventional surface mount type crystal controlled oscillator described in FIGS. 5A and 5B.

Similarly to the above-described FIGS. 5A and 5B, for the electrical connection between the output terminal 2 of the crystal package 1 and the external terminal 4 of the circuit package 3, an anisotropy conductive adhesive 6 is used. This anisotropy conductive adhesive 6 has an adhesive property by having solder micro particles 61 dispersed in an epoxy resin 62, which is a thermosetting resin. This anisotropy conductive adhesive 6 is interposed between the back surface 1A of the crystal package 1 and the upper surface 3A of the circuit package 3. In the embodiment 1, on all area of the upper surface 3A of the circuit package 3 including the external terminal 4, the anisotropy conductive adhesive 6 is applied. Then, the back surface of the crystal package 1 is placed on the upper surface of the circuit package 3, and the positions are adjusted such that the output terminal 2 and external terminal 4 face each other correctly.

After the position adjustment, the crystal package 1 and the circuit package 3 are pressurized toward each other's adhesion direction and put through a reflow process in that state. This reflow process melts the epoxy resin 62 and heats the dispersed solder micro particles 61. As illustrated in FIG. 2, assuming that a thickness of the output terminal 2 formed at the crystal package 1 is C μm, a thickness of the external terminal 4 formed at the circuit package 3 is D μm, and an average outside diameter of the solder micro particles 61 dispersed in the anisotropy conductive adhesive 6 is E μm, the dimensional relation is set to (C+D)>E.

By setting the dimensional relation as illustrated in FIG. 2, the heated solder micro particles 61 are crushed with the above-described pressing pressure between the output terminal 2 of the crystal package 1 and the external terminal 4 of the circuit package 3, and the output terminal 2 and the external terminal 4 become electrically connected. The melted thermosetting resin 62 spreads and moistens all over the back surface 1A including the output terminal 2 of the crystal package 1 as well as the upper surface 3A including the external terminal 4 of the circuit package 3. Then in cooling after the reflow process, the thermosetting resin 62 hardens and bonds the two surfaces mechanically and strongly.

Thus, setting (C+D)>E whereas: a thickness of the output terminal 2 formed at the crystal package 1 is C μm, a thickness of the external terminal 4 formed at the circuit package 3 is D μm, and an average outside diameter of the solder micro particles 61 dispersed in the anisotropy conductive adhesive 6 is E μm, prevents the above-described electrical connection failure, which was described as a problem faced by the conventional technique.

The description above assumes that the facing surfaces of the crystal package 1 and the circuit package 3 are parallel to each other. The description below will explain the cases having a non-parallel distortion such as a deflection on a surface.

Figure 3:
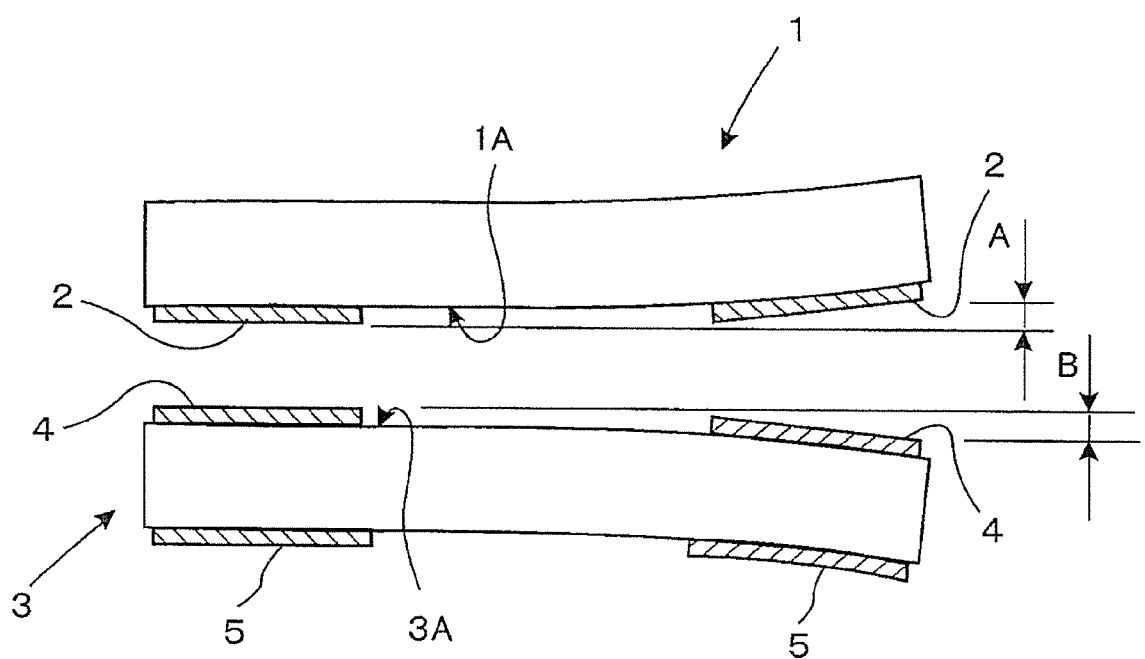
FIG. 3 is a cross-sectional schematic view illustrating an allowable amount of non-parallel distortion between the facing surfaces of the crystal package 1 and the circuit package 3.

FIG. 3 is a cross-sectional schematic view illustrating an allowable amount of non-parallel distortion between the facing surfaces of the crystal package 1 and the circuit package 3. In this view, the same like reference numerals are used for the same functional components in the other views. In FIG. 3, the deflection amount between the surfaces of the output terminals 2 toward a direction away from the external terminal 4 of the circuit package 3 is denoted as A (A≥0). The plurality of the output terminals 2, which have flat shapes, are disposed on the back surface 1A of the container of the crystal package 1. Also, the deflection amount between the surfaces of the external terminals 4 toward a direction away from the above-described output terminal 2 of the crystal package 1 is denoted as B (B≥0). The plurality of the external terminals 4, which have flat shapes, are disposed on the upper surface 3A of the container of the circuit package 3. The crystal package 1 and the circuit package 3 that satisfy the sum of (A+B)≤20 μm are used.

The crystal package 1 and the circuit package 3 that do not satisfy the above-described formula (A+B)≤20 μm are discarded before bonding. Needless to say, when A=0 or B=0, only one of the crystal package 1 and the circuit package 3 is discarded.

According to this embodiment, as illustrated in FIG. 5B, the solder micro particles 61a crushed between the output terminal 2 and the external terminal 4 provide a favorable bonding and improve the production yield of the bonding type crystal controlled oscillator.

Embodiment 2

Figure 4A:
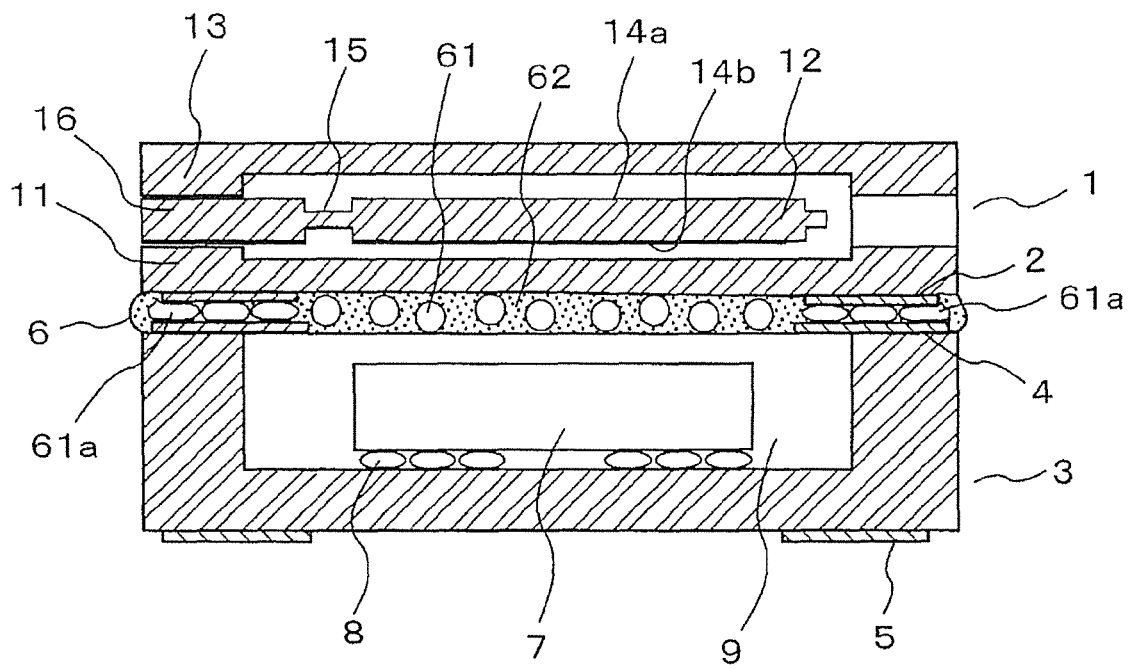
FIG. 4A is a cross-sectional schematic view illustrating a bonding type crystal controlled oscillator according to an embodiment 2 of this disclosure.
Figure 4B:
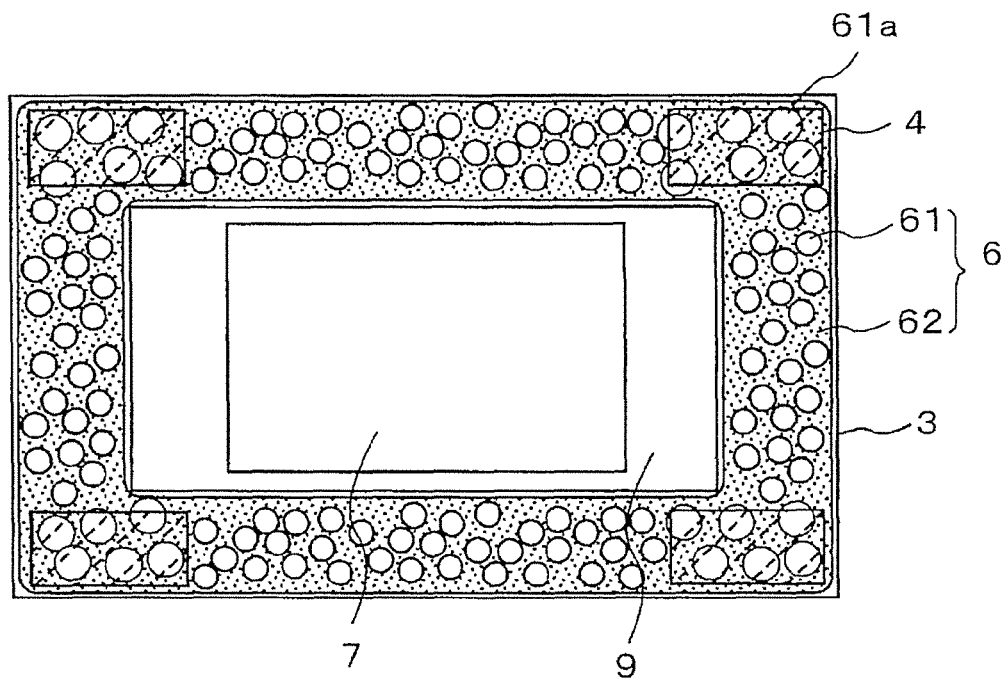
FIG. 4B is a plan schematic view illustrating a circuit package viewed from a crystal package side.

FIGS. 4A and 4B each illustrate a bonding type crystal controlled oscillator according to an embodiment 2 of this disclosure. FIG. 4A is a cross-sectional schematic view, and FIG. 4B is a plan schematic diagram illustrating a circuit package of FIG. 4A viewed from the crystal package side. In this view, the same like reference numerals are used for the same functional components in FIG. 1 through FIG. 3 and FIGS. 5A and 5B and FIG. 6. This embodiment is a bonding type crystal controlled oscillator with the crystal package 1 and the circuit package 3 both constituted by processing a crystal blank.

The crystal package 1 is configured by attaching a bottom wall 11, a crystal element 12, and a lid wall 13 together. These bottom wall 11, crystal element 12, and lid wall 13 are all formed by processing a crystal blank. On both of the surfaces of the crystal element 12, excitation electrodes 14a and 14b are respectively formed. The crystal element 12 is cantilevered from a base portion 16 via a connecting portion 15. Oscillation signals from the crystal element 12 are connected to the output terminal 2 via a conductor (not shown). Thus, in this embodiment, the crystal package 1, which constitutes a bonding type crystal controlled oscillator, is entirely constituted with a crystal blank.

Also in this embodiment, the container of the circuit package 3 is also formed by processing a crystal blank. This container has a depressed portion 9 formed in a relatively thick crystal blank by etching and includes a wiring pattern (not shown) on a bottom surface (not shown) of the depressed portion 9. An IC chip 7 is mounted on the wiring pattern with bumps 8 of the IC chip 7 connected to electrode pads of this wiring pattern. The above-described wiring pattern is used for, for example, the connection between the external terminal 4 and the IC chip 7.

As illustrated by FIG. 4B, a plurality of external terminals 4 (four terminals are shown here) are disposed at edge portions of open ends of the circuit package 3. The solder micro particles 61a between the external terminals 4 and the output terminals 2 (see FIG. 4A) are crushed and have widened planer surfaces. On the circuit package 3, open ends other than the areas requiring electrical connection are mechanically bonded with the thermosetting resin 62.

In this embodiment, the crystal package 1 and the circuit package 3 each have a container (all configuration components of the crystal package 1) configured with crystal blank. However, only one of the packages may be configured with a known substrate (glass epoxy plate, ceramic plate, glass plate, or similar) other than crystal blank.

With this embodiment, formation of solder micro particles crushed between an output terminal of a crystal package and an external terminal of a circuit package provide a favorable bonding for a bonding type crystal controlled oscillator, and improves the production yield of the bonding type crystal controlled oscillator.

Application of this disclosure is not limited to a crystal controlled oscillator. This disclosure may be applied to various types of electronic components using an anisotropy conductive adhesive made of thermosetting resin containing solder particles.

A bonding type crystal controlled oscillator of the disclosure is (2) a bonding type crystal controlled oscillator that includes a crystal package that houses a crystal oscillator; and a circuit package that houses an electronic circuit such as an IC chip component constituting an oscillation circuit with the crystal oscillator. The circuit package and the crystal package being bonded by two-tier bonding. (2) The crystal package includes a container that has a back surface facing the circuit package and includes a plurality of output terminals with a flat shape, the plurality of output terminals forming one step higher than the back surface. (3) The circuit package includes an upper surface facing the crystal package and a plurality of external terminals with a flat shape disposed at positions corresponding to the plurality of output terminals formed on the crystal package, the plurality of external terminals forming one step higher than the upper surface. (4) An anisotropy conductive adhesive is interposed between the back surface of the crystal package facing the circuit package and the upper surface of the circuit package facing the crystal package, the anisotropy conductive adhesive including a thermosetting resin containing solder micro particles dispersed in the thermosetting resin. (5) Assuming that a thickness of the output terminal formed at the crystal package is C μm, a thickness of the external terminal formed at the circuit package is D μm, and an average outside diameter of the solder micro particles dispersed in the anisotropy conductive adhesive is E μm. (6) The dimensional relation is set to (C+D)>E.

(7) Assuming that the average outside diameter E of the solder micro particles is 20 μm to 30 μm, the sum (C+D) of the thickness of the output terminal formed at the crystal package and the thickness of the external terminal formed at the circuit package is equal to or more than 30 μm.

(8) The container of the crystal package is a product by processing a crystal blank among the container of the crystal package and the circuit package.

(9) Both of the containers of the crystal package and the circuit package are each a product by processing a crystal blank.

(10) Assuming that: a deflection amount between surfaces of the output terminals toward a direction away from the external terminal of the circuit package is denoted as A (A≥0), the plurality of the output terminals with a flat shape being disposed on the back surface of the container of the crystal package; and a deflection amount between surfaces of the external terminals toward a direction away from the output terminal of the crystal package is denoted as B (B≥0), the plurality of the external terminals with a flat shape being disposed on the upper surface of the container of the circuit package, the crystal package and the circuit package that satisfy a sum of (A+B)≤20 μm are used to be bonded.

The thickness of the output terminal formed on the crystal package is denoted as thickness C. The thickness of the external terminal formed on the circuit package is denoted as thickness D. By making the sum of the thicknesses C and D larger than an average outside diameter E of solder micro particles, the output terminal formed on the crystal package and the external terminal formed on the circuit package are certainly able to crush the solder micro particles and prevent electrical conduction failures between the two terminals. Facing areas other than the output terminal and the external terminal are strongly bonded with thermosetting resin, which constitutes the anisotropy conductive adhesive.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. A bonding type crystal controlled oscillator, comprising:
    a crystal package that houses a crystal oscillator; and
    a circuit package that houses an electronic circuit component constituting an oscillation circuit with the crystal oscillator, the circuit package and the crystal package being bonded by two-tier bonding, wherein
    the crystal package includes a container that has a back surface facing the circuit package and includes a plurality of output terminals with a flat shape, the plurality of output terminals forming one step higher than the back surface,
    the circuit package includes an upper surface facing the crystal package and a plurality of external terminals with a flat shape disposed at positions corresponding to the plurality of output terminals formed on the crystal package, the plurality of external terminals forming one step higher than the upper surface,
    an anisotropy conductive adhesive is interposed between the back surface of the crystal package facing the circuit package and the upper surface of the circuit package facing the crystal package, the anisotropy conductive adhesive including a thermosetting resin containing solder micro particles dispersed in the thermosetting resin, and
    assuming that a thickness of the output terminal formed at the crystal package is C μm, a thickness of the external terminal formed at the circuit package is D μm, and an average outside diameter of the solder micro particles dispersed in the anisotropy conductive adhesive is E μm, the dimensional relation is set to (C+D)>E,
    wherein assuming that:
        a deflection amount between surfaces of the output terminals toward a direction away from the external terminal of the circuit package is denoted as A (A≥0), the plurality of the output terminals with a flat shape being disposed on the back surface of the container of the crystal package; and
        a deflection amount between surfaces of the external terminals toward a direction away from the output terminal of the crystal package is denoted as B (B≥0), the plurality of the external terminals with a flat shape being disposed on the upper surface of the container of the circuit package,
    the crystal package and the circuit package that satisfy a sum of (A+B)≤20 μm are used to be bonded.

2. The bonding type crystal controlled oscillator according to claim 1, wherein
    assuming that the average outside diameter E of the solder micro particles is 20 μm to 30 μm, the sum (C+D) of the thickness of the output terminal formed at the crystal package and the thickness of the external terminal formed at the circuit package is equal to or more than 30 μm.

3. The bonding type crystal controlled oscillator according to claim 1, wherein
    the container of the crystal package is a product by processing a crystal blank among the container of the crystal package and the circuit package.

4. The bonding type crystal controlled oscillator according to claim 1, wherein
    both of the containers of the crystal package and the circuit package are each a product by processing a crystal blank.

* * * * *